(12) United States Patent
Bower et al.

(10) Patent No.: US 10,193,025 B2
(45) Date of Patent: Jan. 29, 2019

(54) INORGANIC LED PIXEL STRUCTURE

(71) Applicant: X-Celeprint Limited, Cork (IE)

(72) Inventors: Christopher Bower, Raleigh, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/440,843

(22) Filed: Feb. 23, 2017

(65) Prior Publication Data
US 2017/0250219 A1  Aug. 31, 2017

Related U.S. Application Data

(60) Provisional application No. 62/301,077, filed on Feb. 29, 2016.

(51) Int. Cl.
| | |
|---|---|
| *H01L 29/20* | (2006.01) |
| *H01L 33/00* | (2010.01) |
| *H01L 33/46* | (2010.01) |
| *H01L 25/075* | (2006.01) |

(52) U.S. Cl.
CPC .......... *H01L 33/46* (2013.01); *H01L 25/0753* (2013.01)

(58) Field of Classification Search
None
See application file for complete search history.

(56) References Cited

U.S. PATENT DOCUMENTS

| | | |
|---|---|---|
| 4,746,202 A | 5/1988 | Perilloux et al. |
| 5,060,027 A | 10/1991 | Hart et al. |
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |

(Continued)

FOREIGN PATENT DOCUMENTS

| | | |
|---|---|---|
| CN | 103677427 A | 3/2014 |
| EP | 1662301 A1 | 5/2006 |

(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).

(Continued)

*Primary Examiner* — Calvin Y Choi
(74) *Attorney, Agent, or Firm* — William R. Haulbrook; Michael D. Schmitt; Choate, Hall & Stewart LLP

(57) ABSTRACT

An inorganic light-emitting diode (iLED) pixel structure includes a transparent pixel substrate having an LED surface, an emission surface opposite the LED surface, and one or more sides other than the LED surface and the emission surface that are not parallel to the LED surface or the emission surface. One or more iLEDs are mounted on the pixel substrate and each iLED has an emission side adjacent to the LED surface of the pixel substrate to emit light into the pixel substrate and out of the emission surface. A reflector is disposed on at least a portion of the one or more sides.

20 Claims, 8 Drawing Sheets

(56) References Cited

U.S. PATENT DOCUMENTS

| | | | |
|---|---|---|---|
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,288,824 B1 * | 9/2001 | Kastalsky | G02B 5/1828 |
| | | | 359/254 |
| 6,340,999 B1 | 1/2002 | Masuda et al. | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,466,281 B1 | 10/2002 | Huang et al. | |
| 6,504,180 B1 | 1/2003 | Heremans et al. | |
| 6,577,367 B2 | 6/2003 | Kim | |
| 6,650,382 B1 | 11/2003 | Sumida et al. | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,828,724 B2 | 12/2004 | Burroughes | |
| 6,933,532 B2 | 8/2005 | Arnold et al. | |
| 6,969,624 B1 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,402,951 B2 | 7/2008 | Cok | |
| 7,417,648 B2 | 8/2008 | Credelle | |
| 7,420,221 B2 | 9/2008 | Nagai | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,614,757 B2 | 11/2009 | Nesterenko et al. | |
| 7,622,367 B1 | 11/2009 | Nuzzo et al. | |
| 7,629,955 B2 | 12/2009 | Asao et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,872,722 B2 | 1/2011 | Kimura | |
| 7,893,612 B2 | 2/2011 | Cok | |
| 7,898,734 B2 | 3/2011 | Coleman et al. | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,948,172 B2 | 5/2011 | Cok et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,004,758 B2 | 8/2011 | Coleman et al. | |
| 8,029,139 B2 | 10/2011 | Ellinger et al. | |
| 8,039,847 B2 | 10/2011 | Nuzzo et al. | |
| 8,058,663 B2 | 11/2011 | Fan et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,536,584 B2 | 9/2013 | Yao | |
| 8,581,827 B2 | 11/2013 | Park et al. | |
| 8,596,846 B2 | 12/2013 | Yankov et al. | |
| 8,599,118 B2 | 12/2013 | Cok | |
| 8,619,011 B2 | 12/2013 | Kimura | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,735,932 B2 | 5/2014 | Kim et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,829,663 B2 | 9/2014 | Pohl et al. | |
| 8,836,624 B2 | 9/2014 | Roberts et al. | |
| 8,854,294 B2 | 10/2014 | Sakariya | |
| 8,860,051 B2 | 10/2014 | Fellows et al. | |
| 8,877,648 B2 | 11/2014 | Bower et al. | |
| 8,884,844 B2 | 11/2014 | Yang et al. | |
| 8,889,485 B2 | 11/2014 | Bower | |
| 8,895,406 B2 | 11/2014 | Rogers et al. | |
| 8,896,505 B2 | 11/2014 | Cok et al. | |
| 8,901,578 B2 | 12/2014 | Kobayakawa et al. | |
| 8,902,152 B2 | 12/2014 | Bai et al. | |
| 8,912,020 B2 | 12/2014 | Bedell et al. | |
| 8,946,760 B2 | 2/2015 | Kim | |
| 8,987,765 B2 | 3/2015 | Bibl et al. | |
| 9,022,632 B2 | 5/2015 | Kim et al. | |
| 9,048,449 B2 | 6/2015 | Kim et al. | |
| 9,105,813 B1 | 8/2015 | Chang | |
| 9,153,171 B2 | 10/2015 | Sakariya et al. | |
| 9,178,123 B2 | 11/2015 | Sakariya et al. | |
| 9,202,996 B2 | 12/2015 | Orsley et al. | |
| 9,226,361 B2 | 12/2015 | Toth | |
| 9,277,618 B2 | 3/2016 | Odnoblyudov et al. | |
| 9,293,422 B1 | 3/2016 | Parsa et al. | |
| 9,308,649 B2 | 4/2016 | Golda et al. | |
| 9,329,430 B2 | 5/2016 | Erinjippurath et al. | |
| 9,343,042 B2 | 5/2016 | Miller et al. | |
| 9,368,683 B1 | 6/2016 | Meitl et al. | |
| 9,412,977 B2 | 8/2016 | Rohatgi | |
| 9,437,782 B2 | 9/2016 | Bower et al. | |
| 9,444,015 B2 | 9/2016 | Bower et al. | |
| 9,520,537 B2 | 12/2016 | Bower et al. | |
| 9,537,069 B1 | 1/2017 | Bower et al. | |
| 9,626,908 B2 | 4/2017 | Sakariya et al. | |
| 9,705,042 B2 | 7/2017 | Bower et al. | |
| 9,741,785 B2 | 8/2017 | Bower et al. | |
| 9,860,955 B2 | 1/2018 | Kim et al. | |
| 9,871,345 B2 | 1/2018 | Bower et al. | |
| 2001/0022564 A1 | 9/2001 | Youngquist et al. | |
| 2002/0096994 A1 | 7/2002 | Iwafuchi et al. | |
| 2002/0171792 A1 | 11/2002 | Kubota et al. | |
| 2004/0080483 A1 | 4/2004 | Chosa | |
| 2004/0135160 A1 | 7/2004 | Cok | |
| 2004/0180476 A1 | 9/2004 | Kazlas et al. | |
| 2004/0212296 A1 | 10/2004 | Nakamura et al. | |
| 2004/0227704 A1 | 11/2004 | Wang et al. | |
| 2004/0252933 A1 | 12/2004 | Sylvester et al. | |
| 2005/0006657 A1 | 1/2005 | Terashita | |
| 2005/0012076 A1 | 1/2005 | Morioka | |
| 2005/0116621 A1 | 6/2005 | Bellmann et al. | |
| 2005/0140275 A1 | 6/2005 | Park | |
| 2005/0168987 A1 | 8/2005 | Tamaoki et al. | |
| 2005/0202595 A1 | 9/2005 | Yonehara et al. | |
| 2005/0264472 A1 | 12/2005 | Rast | |
| 2005/0275615 A1 | 12/2005 | Kahen et al. | |
| 2005/0285246 A1 | 12/2005 | Haba et al. | |
| 2006/0051900 A1 | 3/2006 | Shizuno | |
| 2006/0063309 A1 | 3/2006 | Sugiyama et al. | |
| 2006/0246811 A1 | 11/2006 | Winters et al. | |
| 2006/0273862 A1 | 12/2006 | Shimmura | |

(56) References Cited

U.S. PATENT DOCUMENTS

| | | |
|---|---|---|
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1* | 2/2009 | Eng ................ G02B 6/0021 257/98 |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320308 A1 | 12/2012 | Yeo et al. |
| 2012/0320566 A1 | 12/2012 | Namekata |
| 2012/0326175 A1* | 12/2012 | Hu ................ H01L 33/46 257/88 |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1* | 10/2013 | Tamaki ................ B05D 5/06 313/503 |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1* | 6/2014 | Smirnov ................ H01L 33/20 257/76 |
| 2014/0159043 A1* | 6/2014 | Sakariya ................ H01L 27/124 257/59 |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |

(56) References Cited

U.S. PATENT DOCUMENTS

| | | |
|---|---|---|
| 2017/0025484 A1 | 1/2017 | Forrest et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/149067 A1 | 9/2017 |
| WO | WO-2017/174632 A1 | 10/2017 |

OTHER PUBLICATIONS

International Search Report, PCT/EP2015/063709, dated Dec. 15, 2015, 6 pages.
International Search Report, PCT/EP2015/069553, dated Nov. 27, 2015, 6 pages.
Lee, S. H. etal, Laser Lift-Offof GaN Thin Film and its Application to the Flexible Light Emitting Diodes, Proc. of SPIE 8460:846011-1-846011-6 (2012).
Partial International Search Report, PCT/EP2016/074093, dated 3 pages, Feb. 13, 2017.
Poher, V. et al., Micro-LED arrays: a tool for two-dimensional neuron stimulation, J. Phys. D: Appl. Phys. 41:094014 (2008).
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).
U.S. Appl. No. 14/788,632, filed Jun. 30, 2015, X-Celeprint Limited.
U.S. Appl. No. 14/807,311, filed Jul. 23, 2015, X-Celeprint Limited.
U.S. Appl. No. 14/822,866, filed Aug. 10, 2015, Bower et al.
Cok, R. S. et al., AMOLED displays with transfer-printed integrated circuits, Journal of SID 19/(4):335-341(2011).
Hamer et al., "63.2: AMOLED Displays Using Transfer-Printed Integrated Circuits," SID 09 Digest, 40(2):947-950 (2009).
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).
Koma, N. et al., 44.2: Novel Front-light System Using Fine-pitch Patterned OLED, SID, 08:655-658 (2008).
Seurin, J.F. et al, High-power red VCSEL arrays, Proc. of SPIE 8639:1-9 (2013).
Yoon, J. et al., Heterogeneously Integrated Optoelectronic Devices Enabled by MicroTransfer Printing, Adv. Optical Mater. 3:1313-1335 (2015).
Matioli, E. et al., High-brightness polarized light-emitting diodes, Light: Science & Applications, 1:e22:1-7 (2012).

\* cited by examiner

INORGANIC LED PIXEL STRUCTURE

PRIORITY APPLICATION

This application claims priority to and benefit of U.S. Patent Application No. 62/301,077, filed Feb. 29, 2016, entitled Inorganic LED Pixel Structure, the content of which is incorporated herein by reference in its entirety.

CROSS REFERENCE TO RELATED APPLICATION

Reference is made to U.S. patent application Ser. No. 14/818,201, entitled Inorganic-Light-Emitter Display with Integrated Black Matrix by Bower et al., the content of which is incorporated herein by reference in its entirety.

FIELD OF THE INVENTION

The present invention relates to a pixel structure and display including inorganic light emitters with improved light emission.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. For example, liquid crystal displays (LCDs) employ liquid crystals to block or transmit light from a backlight behind the liquid crystals and organic light-emitting diode (OLED) displays rely on passing current through a layer of organic material that glows in response to the electrical current.

Inorganic light-emitting diodes (iLEDs) are often used as light sources for displays and lighting. Inorganic LEDs are typically made in a semiconductor material (such as GaAs, GaN, or InGaN) that has a large optical index of refraction compared to the glass or polymer substrates on which they are often mounted or the air in which they are viewed. Hence, light is often trapped in the semiconductor material due to total internal reflection and various light management structures are provided in LEDs to improve the light output. When iLEDs are mounted on a glass or polymer substrate, light is also trapped in the substrate because the optical index of refraction of the substrate is less than that of the semiconductor material but more than the optical index of refraction of air. More than 40% or even 50% of the photons formed in a diode junction can be trapped and ultimately lost in such structures. Furthermore, light emitted by one pixel can propagate through a substrate and be emitted near another pixel, reducing the optical sharpness of the display.

It is also important to reduce the reflection of ambient light from a display surface, such as a substrate. In order to improve the display contrast of light-emissive displays, display designers typically use anti-reflection layers on the front cover of displays and light-absorbing layers internal to the display to reduce ambient light reflection. For example, OLED displays often employ circular polarizers on the cover glass and LCDs use an ambient-light-absorbing black matrix in combination with color filters used to color the white light emitted by the LCD backlights. These black-matrix structures are either in a common structure with the color filters or between the viewer and the color filter. For example, U.S. Pat. No. 6,466,281 entitled Integrated black matrix/color filter structure for TFT-LCD describes a light-shielding layer located above the switching transistors in the display. U.S. Patent Application Publication No. 2007/0077349 entitled Patterning OLED Device Electrodes and Optical Material describes a black matrix integrated into an electrically insulating layer to absorb unwanted light in an RGBW configuration. Similarly, U.S. Pat. No. 7,402,951 entitled OLED Device having Improved Contrast discloses a contrast enhancement element with a light-absorbing layer for absorbing ambient light. U.S. Pat. No. 6,812,637, U.S. Pat. No. 7,466,075, and U.S. Pat. No. 7,091,523 all describe the use of black-matrix structures to improve contrast. These light-absorbing elements or layers are located between a viewer and the light-emitting OLED pixels.

Inorganic LED displays are also known to use black-matrix structures, as disclosed in U.S. Pat. No. 7,919,342 entitled Patterned Inorganic LED Device in which a patterned conductive layer between and above the patterned light emitters can act as a black matrix to absorb light and increase the display contrast.

Black matrix structures in conventional displays can locate light-absorbing elements or layers between a viewer and the light-emitting pixels. Although such an arrangement can be relatively effective in absorbing ambient light, they also absorb emitted light and can create viewing-angle dependence for brightness. Such multi-layer structures are more complex and costly to manufacture and the additional layers can also absorb emitted light, reducing display efficiency. Thus, there remains a need for improvements in display systems, pixel structures, and methods of manufacturing that provide improved image quality and contrast, improved emission efficiency, and a reduced manufacturing cost in a mechanically and environmentally robust structure.

SUMMARY OF THE INVENTION

The present invention provides an inorganic light-emitting diode (iLED) pixel structure including a transparent pixel substrate having an LED surface, an emission surface opposite the LED surface, and one or more sides that meet the LED surface, the emission surface, or both. One or more of the surfaces or sides can be light diffusive. An iLED is mounted on the pixel substrate. The iLED can emit light through the LED surface and out through the opposite emission surface of the pixel substrate. A reflector is disposed on at least a portion of the one or more sides. The iLED can be mounted on the pixel substrate by microtransfer printing and can include at least a portion of a tether.

A plurality of iLEDs can be mounted on the LED surface of the pixel substrate. The plurality of iLEDs can include a red LED emitting red light, a green LED emitting green light, and a blue LED emitting blue light to form a full-color pixel structure. In another embodiment, the pixel structure includes an integrated circuit disposed on the pixel substrate. The integrated circuit can be electrically connected to the iLEDs to provide control signals to the iLEDs.

A display can include a plurality of the pixel structures disposed on a front substrate with a black matrix disposed between the pixel structures. Alternatively, a display can include a plurality of the pixel structures disposed on a patterned back substrate with a black matrix disposed between the pixel structures. In this embodiment, the back substrate material can also be the black matrix. The back substrate can include vias exposing iLED electrodes connected to electrical conductors, for example solder bumps to enable surface mounting. The pixel structures can be electrically interconnected over the front substrate, the back substrate, or electrically connected to a backplane to form the display. The pixel structures can be micro-transfer printable or surface mountable. A plurality of pixel structures can be disposed on a front or back substrate and a plurality of front or back substrates assembled, for example on a backplane, to provide a display.

A method of making an inorganic light-emitting diode (iLED) pixel structure includes providing a source wafer of one or more releasable iLEDs suitable for micro-transfer printing, providing one or more pixel substrates, and forming a reflector on at least a portion of the sides of the one or more pixel substrates. An iLED is micro-transfer printed onto each pixel substrate.

In one embodiment, a front substrate is provided and pixel substrates with micro-transfer printed iLEDs are spaced apart on the front substrate, for example by micro-transfer printing or by surface mounting. Alternatively, the pixel substrates are formed spaced apart on the front substrate and the iLEDs micro-transfer printed on the pixel substrates. The reflectors can be formed on the pixel substrates either before or after the iLEDs are micro-transfer printed on the pixel substrates or either before or after the pixel substrates are disposed on the front substrate. A black matrix is provided between the pixel substrates. The black matrix can be provided either before or after the pixel substrates are formed or disposed on the front substrate. The front substrate can be a display substrate.

In another embodiment, a back substrate is provided in contact with the iLEDs on a side of the iLEDs opposite the pixel substrate and front substrate. The back substrate can be a black matrix and can be patterned to open vias to iLED electrodes. The electrodes can be bumped, that is solder provided in contact with and extending from the ILED electrodes and the structure can then be provided in contact with a backplane (for example using surface-mount methods, structures, and processes), and soldered onto the backplane. The front substrate can be removed before or after any backplane operations by using methods such as grinding or releasable adhesives provided between the pixel substrates and the front substrate.

In certain embodiments, each of the plurality of light-emitting diodes has a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

In certain embodiments, the plurality of inorganic light-emitting diodes includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of iLEDs comprises a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more iLEDs of the plurality of iLEDs, each of the two or more iLEDs within a pixel are spatially separated from an adjacent iLEDs within the pixel by a second distance, and the first distance is greater than the second distance.

In certain embodiments, the plurality of pixels forms an array and the array of pixels forms a display.

The present invention provides improved image quality and contrast, emission efficiency, and a reduced manufacturing cost in a mechanically and environmentally robust structure useful in a display system.

In one aspect, the disclosed technology includes an inorganic light-emitting diode (iLED) pixel structure, including: a transparent pixel substrate having an LED surface, an emission surface opposite the LED surface, and one or more sides other than the LED surface and the emission surface that are not parallel to the LED surface or the emission surface; an iLED mounted on the pixel substrate, the iLED having an emission side adjacent to the LED surface of the pixel substrate to emit light into the pixel substrate and out of the emission surface; and a reflector on at least a portion of the one or more sides.

In certain embodiments, the pixel substrate has a thickness that is greater than a thickness of the iLED.

In certain embodiments, the pixel structure comprises only one iLED.

In certain embodiments, the one or more sides are non-orthogonal to the LED surface.

In certain embodiments, the emission surface is larger than the LED surface.

In certain embodiments, a thickness of the pixel substrate is less than a width of the pixel substrate.

In certain embodiments, the iLED has electrodes on a common side of the iLED adjacent to the pixel substrate.

In certain embodiments, the iLED has electrodes on a common side of the iLED opposite the pixel substrate.

In certain embodiments, the opposite the pixel substrate is a glass or a semiconductor.

In certain embodiments, the iLED comprises at least a portion of a tether.

In certain embodiments, the pixel substrate comprises at least a portion of a tether.

In certain embodiments, the inorganic light-emitting diode (iLED) pixel structure includes a plurality of iLEDs mounted on a common pixel substrate.

In certain embodiments, the plurality of iLEDs comprises a red iLED that emits red light, a green iLED that emits green light, and a blue iLED that emits blue light.

In certain embodiments, each iLED of the plurality of iLEDs emits a different color light.

In certain embodiments, the inorganic light-emitting diode (iLED) pixel structure includes a plurality of pixel substrates arranged on a common substrate to form a one-dimensional or two-dimensional array of pixel substrates.

In certain embodiments, the pixel substrates are separated by a light-absorbing black matrix.

In certain embodiments, the common substrate is a front substrate affixed to the pixel substrate emission surface.

In certain embodiments, the front substrate has an optical refractive index equal to or greater than an optical refractive index of the pixel substrate.

In certain embodiments, the pixel substrate is thicker than the front substrate.

In certain embodiments, the common substrate is a patterned back substrate to which the iLEDs are affixed.

In certain embodiments, the iLED has electrodes and comprising a patterned back substrate to which the pixel substrates are affixed and wherein the back substrate comprises vias exposing the electrodes.

In certain embodiments, the inorganic light-emitting diode (iLED) pixel structure includes a separate conductor in electrical contact with each of the electrodes.

In certain embodiments, each of the separate conductors comprises an exposed conductive bump.

In certain embodiments, the conductors comprise solder or are solder.

In certain embodiments, the conductors, back substrate, iLED, and pixel substrate form a surface-mount device.

In certain embodiments, one or more of the LED surface, the emission surface, or one or more sides is light diffusive.

In certain embodiments, the iLED extends over a portion but less than all of the LED surface.

In certain embodiments, the reflector extends over at least a portion of the LED surface that is not covered by the iLED.

In certain embodiments, the pixel structure forms a micro-transfer printable device or forms a surface-mount device.

In certain embodiments, the iLED comprises electrodes and the pixel substrate comprises connection posts connected to the electrodes.

In certain embodiments, the iLED has a width from 2 to 5 µm, 5 to 10 µm, 10 to 20 µm, or 20 to 50 µm, wherein the iLED has a length from 2 to 5 µm, 5 to 10 µm, 10 to 20 µm, or 20 to 50 µm, or wherein the iLED has a height from 2 to 5 µm, 4 to 10 µm, 10 to 20 µm, or 20 to 50 µm.

In certain embodiments, the pixel structure has a height or width dimension of 200 µm or less.

In certain embodiments, the pixel structure has a height or width dimension of 1 mm or less and 200 µm or more.

In certain embodiments, the iLEDs have electrodes and comprising an integrated circuit disposed on the pixel substrate or formed in or on the pixel substrate, and wherein the integrated circuit has electrical connections at least some of which are electrically connected to the iLED electrodes to control the iLEDs.

In certain embodiments, inorganic light-emitting diode (iLED) pixel structure includes a separate conductor in electrical contact with each of the electrodes or integrated circuit electrical connections and wherein each of the separate conductors comprises an exposed conductive bump.

In another aspect, the disclosed technology includes a method of making an inorganic light-emitting diode (iLED) pixel structure, including: providing a source wafer of one or more releasable iLEDs suitable for micro-transfer printing; providing one or more pixel substrate, wherein each of the one or more pixel substrates has an LED surface, an emission surface opposite the LED surface, and one or more sides other than the LED surface and the emission surface that are not parallel to the LED surface or the emission surface; forming a reflector on at least a portion of the sides of the one or more pixel substrates; and micro-transfer printing an iLED onto each pixel substrate.

In certain embodiments, the method includes providing a front substrate and comprising mounting the pixel substrate on the front substrate.

In certain embodiments, the method includes micro-transfer printing the iLED onto each pixel substrate before mounting the pixel substrate on the front substrate.

In certain embodiments, the method includes micro-transfer printing the iLED onto each pixel substrate after mounting the pixel substrate on the front substrate.

In certain embodiments, the method includes providing a patterned back substrate in contact with the iLEDs.

In certain embodiments, the method includes removing the front substrate.

In certain embodiments, the method includes providing a plurality of iLEDs and a corresponding plurality of pixel substrates.

In certain embodiments, the method includes spacing apart the pixel substrates over the front substrate and providing a black matrix between the spaced apart pixel substrates.

In certain embodiments, the method includes providing a plurality of iLEDs and micro-transfer printing the plurality of iLEDs onto a common pixel substrate.

In certain embodiments, the plurality of iLEDs comprises a red iLED that emits red light, a green iLED that emits green light, and a blue iLED that emits blue light.

In certain embodiments, the pixel substrate is a micro-transfer printable pixel substrate formed on a substrate wafer and comprising micro-transfer printing the pixel substrate onto a front substrate or a backplane.

In certain embodiments, the iLED comprises electrodes, the pixel substrate comprises connection posts connected to the electrodes, and a front substrate or a backplane comprises electrical connections and comprising micro-transfer printing the pixel structure so that the connection posts are in contact with, are pressed into, or pierce respective electrical connections.

In another aspect, the disclosed technology includes a display, including a display substrate; and a plurality of pixel structures according to claim 1 arranged on and affixed to the display substrate.

In certain embodiments, the display substrate is a front substrate and the emission surfaces of the pixel substrates are affixed to the front substrate.

In certain embodiments, the display substrate is a back substrate and the iLEDs are affixed to the back substrate.

In certain embodiments, the pixel structures are spaced apart and the space between the pixel structures comprises a black matrix.

In certain embodiments, the plurality of iLEDs comprises a red iLED that emits red light, a green iLED that emits green light, and a blue iLED that emits blue light.

In certain embodiments, the iLEDs have electrodes and comprising an integrated circuit disposed on the pixel substrate, and wherein the integrated circuit has electrical connections at least some of which are electrically connected to the iLED electrodes to control the iLEDs.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
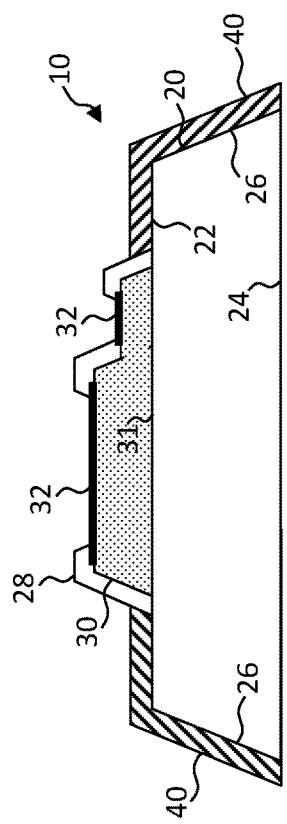
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the cross section of FIG. 1, in an embodiment of the present invention an inorganic light-emitting diode (iLED) pixel structure 10 includes a transparent pixel substrate 20 having an LED surface 22, an emission surface 24 opposite the LED surface 22, and one or more sides 26 other than the LED surface 22 and the emission surface 24 that are not parallel to the LED surface 22 or the emission surface 24. The sides 26, the LED surface 22, or emission surface 24 can be facets of a three-dimensional solid.

An inorganic light-emitting diode (iLED) 30 is mounted or disposed on the pixel substrate 20. The iLED 30 has an emission side 31 adjacent to or in contact with the LED surface 22 of the pixel substrate 20. The iLED 30 emit lights into the pixel substrate 20 through the emission side 31 of the iLED 30. The emitted light passes into the pixel substrate 20 through the LED surface 22 of the pixel substrate 20 and out of the pixel substrate 20 through the emission surface 24 of the pixel substrate 20. A reflector 40 for reflecting light emitted from the iLED 30 into the pixel substrate 20 is disposed on at least a portion of the one or more sides 26 of the pixel substrate 20. As used herein, the iLED 30 is an inorganic light emitter and can include, for example, optically pumped elements such as phosphors, quantum dots, semiconductor structures, or light down-convertors. The iLED 30 is an electrically powered inorganic light emitter, either a point emitter or area emitter and can include additional organic or inorganic materials. In an embodiment, the iLED 30 is an inorganic light-emitting diode made of a semiconductor or a compound semiconductor, for example a crystalline semiconductor, such as GaAs, AlGaAs, GaAsP, GaP, AlGaInP, GaN, InGaN, ZnSe, or SiC.

In an embodiment of the present invention, the iLED 30 has electrodes 32 for providing power to the iLED 30 exposed through openings in a patterned dielectric layer 28 protecting the iLED 30. As illustrated in FIG. 1, the electrodes 32 are on a common side of the iLED 30 opposite the pixel substrate 20 and opposite the iLED emission side 31. In another embodiment, the electrodes 32 are on a common side of the iLED 30 adjacent to the pixel substrate 20 on the iLED emission side 31 (not shown). The electrodes 32 can be transparent but, in an embodiment, are opaque or reflective electrodes 32 The electrodes 32 can be formed and patterned by photolithography and can be a metal or metal alloy, such as aluminum, tantalum, silver, gold, titanium or other conductive metal.

In a further embodiment of the present invention, the iLED 30 is a micro-transfer printable iLED 30 provided on an iLED source wafer and is micro-transfer printed onto the pixel substrate 20 using a transfer stamp. Mechanical pressure from the transfer stamp fractures a tether connecting the iLED 30 to the iLED source wafer thereby releasing the iLED 30 from the iLED source wafer onto the transfer stamp. The released iLED 30 is then transferred to the pixel substrate 20 by the transfer stamp. The iLED 30 therefore can include at least a portion of a tether remaining attached to the iLED 30 after fracturing the tether with pressure from the transfer stamp. A discussion of micro-LEDs and micro-LED displays can be found in U.S. patent application Ser. No. 14/743,981, filed Jun. 18, 2015, entitled Micro Assembled LED Displays and Lighting Elements, the contents of which are hereby incorporated by reference in their entirety.

In a further embodiment of the present invention, in addition to the iLED 30 the pixel substrate 20 is also provided as a micro-transfer printable pixel substrate 20 provided on a pixel substrate source wafer and is micro-transfer printed using a transfer stamp. In one embodiment, the pixel substrate 20 is micro-transfer printed from the pixel substrate source wafer with the iLED 30 micro-transfer printed on the pixel substrate 20; in another embodiment, the pixel substrate 20 is micro-transfer printed from the pixel substrate source wafer without the iLED 30. In either case, mechanical pressure from the transfer stamp fractures a tether connecting the pixel substrate 20 to the pixel substrate source wafer thereby releasing the pixel substrate 20 from the pixel substrate source wafer onto the transfer stamp. The released pixel substrate 20 is then transferred by the transfer stamp. The pixel substrate 20 therefore can include at least a portion of a tether. The pixel substrate 20 can be glass, polymer, or a semiconductor. The pixel substrate 20 is transparent because it is at least partially transparent to the frequencies of light emitted by the iLED 30, for example, the pixel substrate 20 can have a transmissivity greater than or equal to 50%, 80%, 90%, or 95% for visible light.

In various embodiments of the present invention, the reflector 40 can be a metal layer, for example a metal such as aluminum evaporated or sputtered on the pixel substrate 20 and patterned using photolithographic methods. The metal can be any reflective metal coating, for example aluminum, titanium, or silver. The reflector 40 can include multiple layers, such as thin metal layers, silica, oxides such as silicon dioxide or tantalum oxide, or nitrides, such as silicon nitrides, or other materials useful in dichroic filters or reflectors. The reflector 40 can be a dichroic reflector 40 tuned to reflect the frequency of light emitted by the iLED 30 or absorb other frequencies of light. In an embodiment, and as shown in FIG. 1, the reflector 40 can extend over a portion but less than all of the LED surface 22 of the pixel substrate 20; for example, the reflector 40 can extend over a portion of the LED surface 22 that is not covered by the iLED 30. The reflector 40 can also cover a portion but less than all of the emission surface 24 (not shown).

Figure 2:
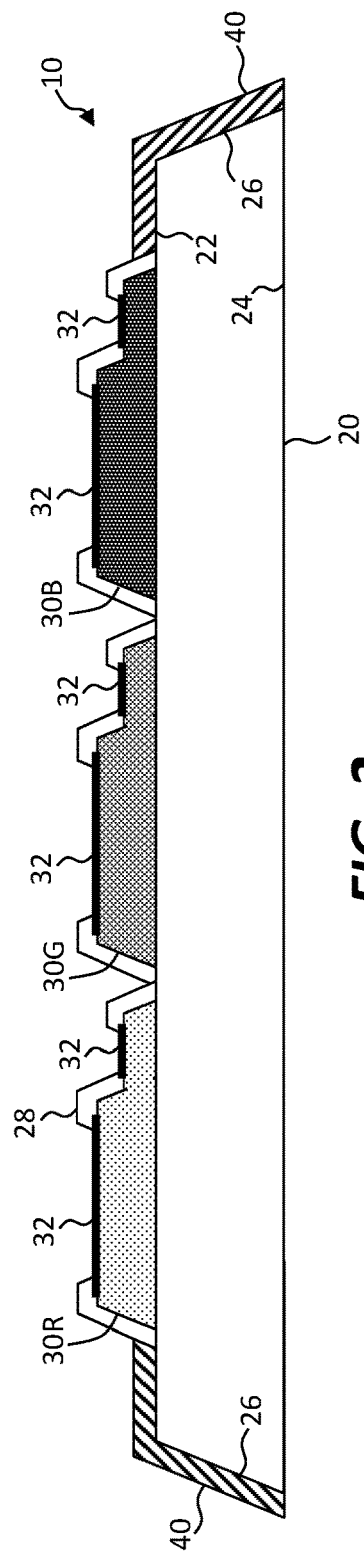
FIG. 2 is a cross section of an embodiment of the present invention having multiple inorganic light-emitting diodes on a common pixel substrate.

Referring to FIG. 2 in another embodiment of the present invention, a plurality of iLEDs 30 are mounted on a common pixel substrate 20. The plurality of iLEDs 30 can include a red iLED 30R that emits red light, a green iLED 30G that emits green light, and a blue iLED 30B that emits blue light. Thus, the pixel structure 10 can be full-color pixel structure 10 and provide a pixel in a display 80 (see FIGS. 4 and 5 described below). In another embodiment, the pixel structure 10 includes an integrated circuit disposed on or formed on or in the pixel substrate. The integrated circuit can have electrical connections that are electrically connected to electrodes 32 of the iLEDs 30 to control or provide control signals to the iLEDs 30 and can be controlled by an external circuit such as a display controller (not shown). For example, the integrated circuit can provide active-matrix control to the iLED(s) 30 disposed on the pixel substrate 20. The integrated circuit can be a chiplet or a bare die, can include at least a portion of a tether, and can be disposed on the pixel substrate 20 using micro-transfer printing.

In operation, electrical power is provided to the iLED 30 through the electrodes 32 from an external source, such as an integrated circuit chiplet, a power supply, or controller (not shown). The electrical power causes the iLED 30 to emit light. The iLED 30 can include structures to facilitate light emission and extraction. The light passes out of the iLED 30 through the iLED emission side 31 and into the pixel substrate 20 through the LED surface 22 of the pixel substrate 20. Light emitted at an angle close to an orthogonal to the LED surface 22 and emission surface 24 of the pixel substrate 20 can pass out of the pixel substrate 20. The LED surface 22 and emission surface 24 of the pixel substrate 20 can be substantially parallel.

However, light emitted at a large angle to the LED surface 22 or emission surface 24 of the pixel substrate 20 can be trapped within the pixel substrate 20 due to total internal reflection. In an embodiment, the interface with the emission surface 24 is air. By providing the sides 26 of the pixel substrate 20 with a reflector 40, iLED-emitted light cannot readily propagate to adjacent pixels in a multi-pixel display through a display substrate, as in the prior art. Thus, the reflector 40 keeps the light emitted by the iLED 30 local to the location of the iLED 30, improving sharpness of a display using the pixel structure 10. Furthermore, the reflector 40 increases light output by reducing the distance emitted light propagates in a display and therefore reduces light absorption. In embodiments of the present invention, the sides 26 are at a non-orthogonal angle to the emission surface 24 or the LED surface 22 (as shown) so that total-internally reflected light that impinges on the sides 26 can be redirected at an angle that allows the light to escape from the pixel substrate 20. Thus, the reflectors 40 and sides 26 improve light extraction from the pixel structure 10. In a further embodiment, one or more of the sides 26, the LED surface 22, or the emission surface 24 are light diffusive. In particular, roughening the sides 26 before or after forming the reflector 40 on the sides 26 can improve light output.

In one embodiment of the present invention, the pixel substrate 20 has a thickness that is greater than a thickness of the iLED 30. Such a thickness can improve the mechanical robustness of the pixel structure 10. The thickness of the pixel substrate 20 can be less than a width of the pixel substrate 20, reducing the distance any trapped light must travel through the pixel substrate 20.

In another embodiment of the present invention, the pixel structure 10 comprises only one iLED 30. Thus, any light emitted from the iLED 30 that would be trapped in the pixel substrate 20 will reflect from the reflector 40 before the trapped light travels any great distance through the pixel substrate 20, reducing light absorption and improving the pixel structure 10 efficiency.

In yet another embodiment, the one or more sides 26 are non-orthogonal to the LED surface 22. For example the pixel substrate 10 can have a trapezoidal cross section in one or more directions, for example orthogonal directions. In such embodiments, the emission surface 24 can be larger than the LED surface 22 of the pixel substrate 20. Such non-orthogonal sides 26 will tend to reflect trapped light out of the pixel structure 10 with fewer reflections, reducing light absorption and improving the pixel structure 10 efficiency.

In the embodiment of FIG. 2, the red, green, and blue iLEDs 30R, 30G, 30B are disposed on a common pixel substrate 20. In this embodiment, the light from all of the red, green, and blue iLEDs 30R, 30G, 30B can propagate through the pixel substrate 20 and can be mixed, thereby providing a full-color pixel, the light from whose subpixels (i.e., the red, green, and blue iLEDs 30R, 30G, 30B) cannot be spatially distinguished. This improved color mixing also improves image quality in a display having such pixel structures 10. A full-color pixel can also include additional or other iLEDs 30, for example a yellow, white, or cyan inorganic light-emitting diode. Thus, the pixel substrate 20 can include more than three iLEDs 30 as well as in integrated control circuit.

In an embodiment of the present invention, each iLED 30 of the plurality of iLEDs 30 emits a different color of light. Thus, in the pixel structure 10 no two iLEDs 30 emit the same color of light, each iLED 30 is different from all of the other iLEDs 30 in the pixel structure 10. Each pixel structure 10 can then be independent and separate from any other pixel structure 10 in a device having multiple pixel structures 10, reducing or limiting the size of the pixel substrates 10 in a display application.

Figure 3:
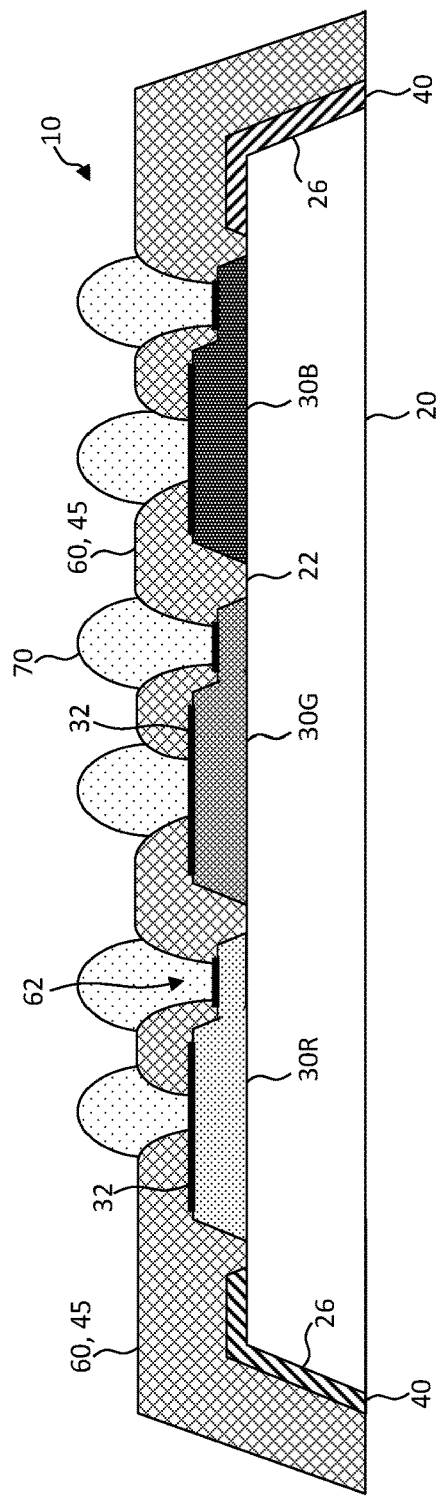
FIG. 3 is a cross section of an embodiment of the present invention having bumped electrical connections.

As shown in the embodiment of FIG. 3, a back substrate 60 is patterned over the electrodes 32 to form vias exposing the electrodes 32. The back substrate 60 can be a black matrix 45 and can extend over the sides 26 and reflectors 40 as well as a portion of the iLED surface 22. The back substrate 60 provides support to the pixel structure 10 and the black matrix reduces ambient light reflections, improving contrast. The back substrate 60 can be a cured resin such as SU8 with impregnated black dyes or pigments such as carbon black. The vias 62 can be filled with electrical conductors 70 such as solder in the form of solder bumps useful for surface mounting the pixel structure 10. The electrical conductors 70 provide electrical conductors to the electrodes 32 of the iLEDs 30 to provide power to the iLEDs 30 and enable the iLEDs 30 to emit light. In an embodiment, the pixel structure 10 is a surface-mount device.

Figure 4:
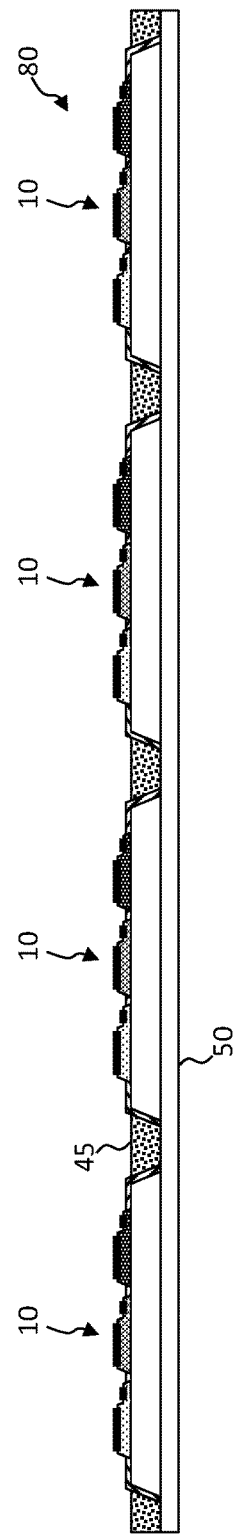
FIG. 4 is a cross section of a display embodiment of the present invention having a front substrate.

Referring to the embodiment of FIG. 4, a plurality of pixel structures 10 such as those of FIG. 2 are arranged on a common substrate to form a one-dimensional or two-dimensional array of pixel substrates 20, for example in a display 80. The pixel substrates 20 can be spatially separated by a light-absorbing black matrix 45. The black matrix 45 can absorb ambient light, thereby increasing the contrast ratio of the display 80. For example, the black matrix 45 can be a resin including black dyes or pigments, can include multiple layers of light-absorbing materials, or can include layers providing constructive or destructive interference for light of a desired frequency.

The common substrate can be a front substrate 50 affixed to the pixel substrate 20 emission surface 24. The front substrate 50 can serve as a display substrate, can be glass or plastic, and can be transparent; for example, the front substrate 50 can have a transmissivity greater than or equal to 50%, 80%, 90%, or 95% for visible light. The front substrate 50 can have a size of a conventional display, for example, a rectangle with a diagonal length of a few centimeters to one or more meters and a thickness of 50 microns to 10 mm or even more. Such substrates are commercially available. The pixel substrates 20 can be much smaller than the front substrate 50 and can be formed on the front substrate 50. Alternatively, the pixel substrates 20 can be substrates that are separate and distinct from the front substrate 50. For example, the pixel substrates 20 can be adhered to the front substrate 50 with a permanent adhesive. In an alternative embodiment, the pixel substrates 20 are releasably adhered to the front substrate 50, as described below with respect to FIGS. 5 and 10.

In an embodiment, the front substrate 50 has an optical refractive index equal to or greater than an optical refractive index of the pixel substrate 20. Alternatively, the front substrate 50 has an optical refractive index equal to or less than an optical refractive index of the pixel substrate 20. By suitable selecting the optical refractive index of the front substrate 50 with respect to the optical refractive index of the pixel substrate 20 and suitable selecting the angles of the sides 26, light output from the iLEDs 30 and the pixel structure 10 can be increased. In a further embodiment, the pixel substrate 20 is thicker than the front substrate 50. This decreases the amount of light that can be trapped in the front substrate 50 due to total internal reflection and reduces the distance light is likely to propagate in the front substrate 50. The front substrate 50 can include anti-reflection layers (not shown) that absorb or transmit at least some of the incident ambient light incident on the display 80.

Figure 5:
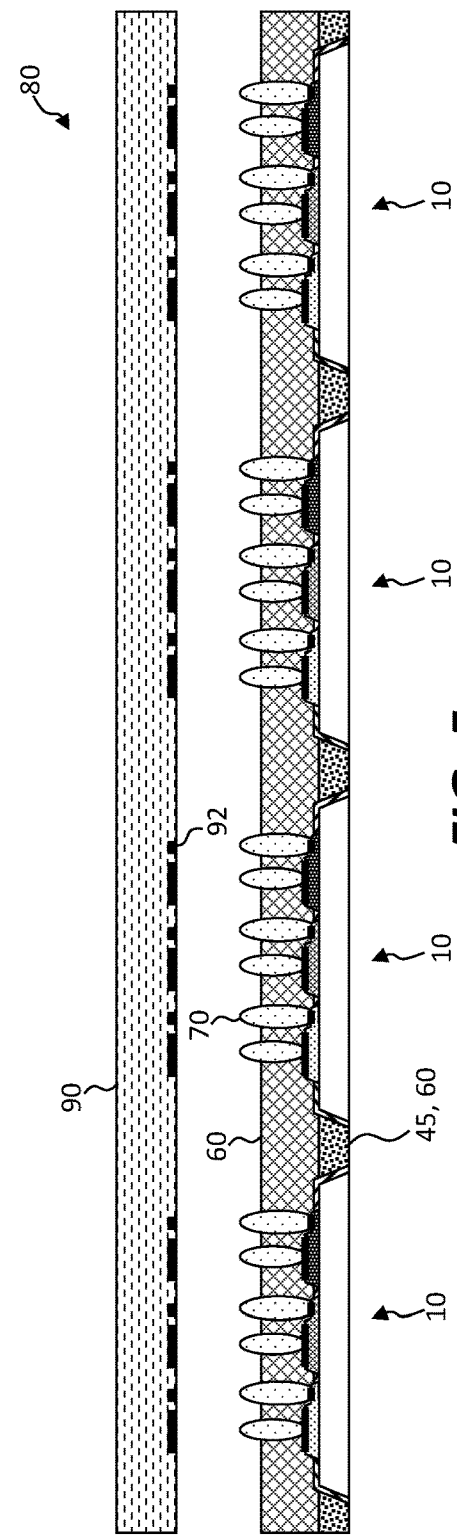
FIG. 5 is an exploded cross section of a display embodiment of the present invention having a back substrate.

Referring to the embodiment of FIG. 5, the common substrate is a back substrate 60 affixed to a side of the iLEDs 30 opposite the iLED emission side 31 of a pixel structure 10 such as the pixel structure 10 of FIG. 3. The back substrate 60 can be, for example, a polymer, resin, or curable resin (for example having UV-activated cross-linking materials, for example SU8). The back substrate material can be patterned using photolithographic methods to expose the electrodes 32 of the iLEDs 30 with vias 62. The black substrate material can also be a black matrix material and in this embodiment can be the black matrix 45. A separate electrical conductor 70 can be patterned in electrical contact with each electrode 32. The electrical conductor 70 can be, for example, a solder and the electrical conductor 70 structure can form a solder bump compatible with surface-mount solder methods. Thus, the electrical conductors 70, back substrate 60, iLED 30, and pixel substrate 20 of each pixel structure 10 together can be a surface-mountable device. Anti-reflection layers (not shown) can also be provided on the emission surface 24 of the pixel substrates 20 in the back substrate 60 embodiment of FIG. 5. The pixel structures 10 can be surface mounted on a backplane 90 and the electrical conductors 70 soldered to wires or connection pads 92 of the backplane 90 to form the display 80.

Figure 6:
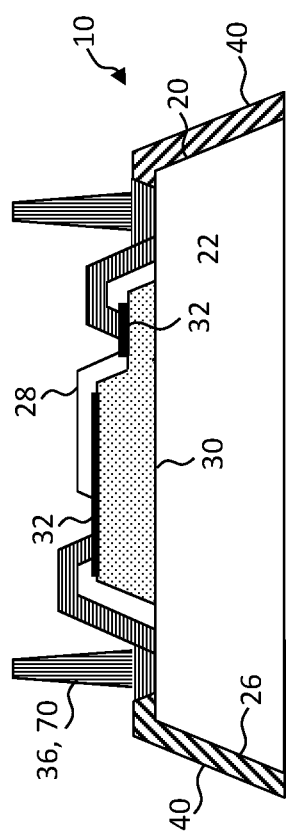
FIG. 6 is a cross section of an embodiment of the present invention having connection posts.

In a further embodiment of the present invention illustrated in FIG. 6, an iLED 30 mounted on a pixel substrate 20, for example by micro-transfer printing, includes connection posts 36 formed on the pixel substrate 20 and electrically connected to the electrodes 32 of the iLED 30. The connection posts 36 thus also serve as the electrical conductors 70. This structure can be provided as a micro-transfer printable pixel structure 10 on a pixel substrate source wafer and micro-transfer printed, for example onto a backplane 90 (FIG. 5) with wires or connection pads 92. The connection posts 36 are forced into or on the connection pads 92 by the micro-transfer printing process, so that no additional photolithographic processing is necessary to make electrical conductors 70 that connect the electrodes 32 to the connection pads 92 of the backplane 90.

In embodiments of the present invention, the iLED 30 or pixel substrate 20 or the pixel structure 10 are micro-transfer printable or surface-mountable devices. In an embodiment, the iLED 30 or the pixel substrate 20 has a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm. The pixel structure 10 can have a height or width dimension of 200 µm or less.

Figure 7:
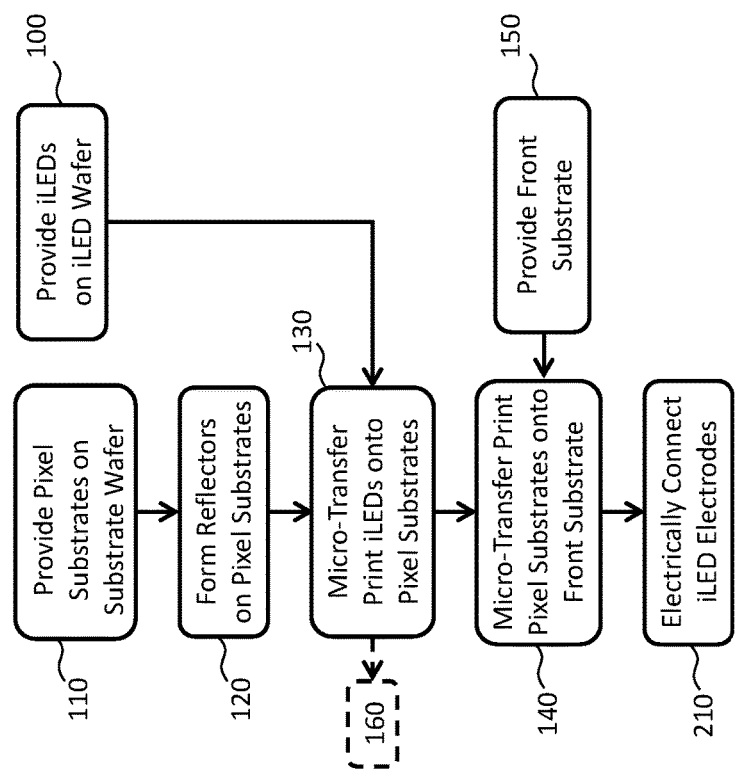
FIGS. 7-10 are flow diagrams illustrating various methods of the present invention.

In a further embodiment of the present invention and referring to FIG. 7, a method of making an inorganic light-emitting diode (iLED) pixel structure 10 includes providing in step 100 one or more iLED source wafers having one or more releasable iLEDs 30 suitable for micro-transfer printing and providing in step 110 one or pixel substrates 20 on a substrate wafer. In an embodiment, the pixel substrate 20 are also suitable for micro-transfer printing. Reflectors 40 are formed on at least a portion of the sides 26 of the one or more pixel substrates 20 in step 120. In step 130, one or more iLEDs 30 are micro-transfer printed onto each pixel substrate 20 to form the pixel structures 10. If multiple iLEDs 30 are micro-transfer printed to the pixel substrate 20, the multiple iLEDs 30 can be micro-transfer printed from a common source wafer or from different source wafers, for example each different source wafer providing a red, green, or blue iLED 30R, 30G, 30B. In an alternative embodiment, the reflectors 40 are formed on at least a portion of the sides 26 after the one or more iLEDs 30 are micro-transfer printed onto each pixel substrate 20 (i.e., step 120 is performed after step 130) to form the pixel structures 10.

In one embodiment of the present invention, a front substrate 50 is provided in step 150 and the pixel structures 10 are disposed or mounted on the front substrate 50 in step 140 (as shown in FIG. 4), for example using micro-transfer printing, pick-and-place, or surface-mount attachment techniques. In yet another embodiment, the reflectors 40 are formed on the sides 26 of the pixel substrate 20 after the pixel substrates 20 are disposed on the front substrate 50 (i.e., step 120 is performed after step 140). An adhesive layer can be provided on the front substrate 50 or pixel substrates 20 to facilitate robustly disposing the pixel substrates 20 on the front substrate 50. The iLED electrodes 32 are electrically connected in step 210, for example, using photolithography, to external power, ground, or control signal sources (not shown) to form a display 80. In another embodiment, a back substrate 60 is formed as described further below with respect to FIG. 10 by going to step 160. In step 210 the electrical conductors 70 are formed on the pixel structures 10 using photolithographic and display substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. Surface mount and solder bump techniques can be used. The electrical conductors 70 can include light-absorbing layers. Inkjet and screen-printing deposition processes and materials can be used to form the patterned electrical conductors 70 such as connection pads 92, wires, or other electrical elements.

Figure 8:
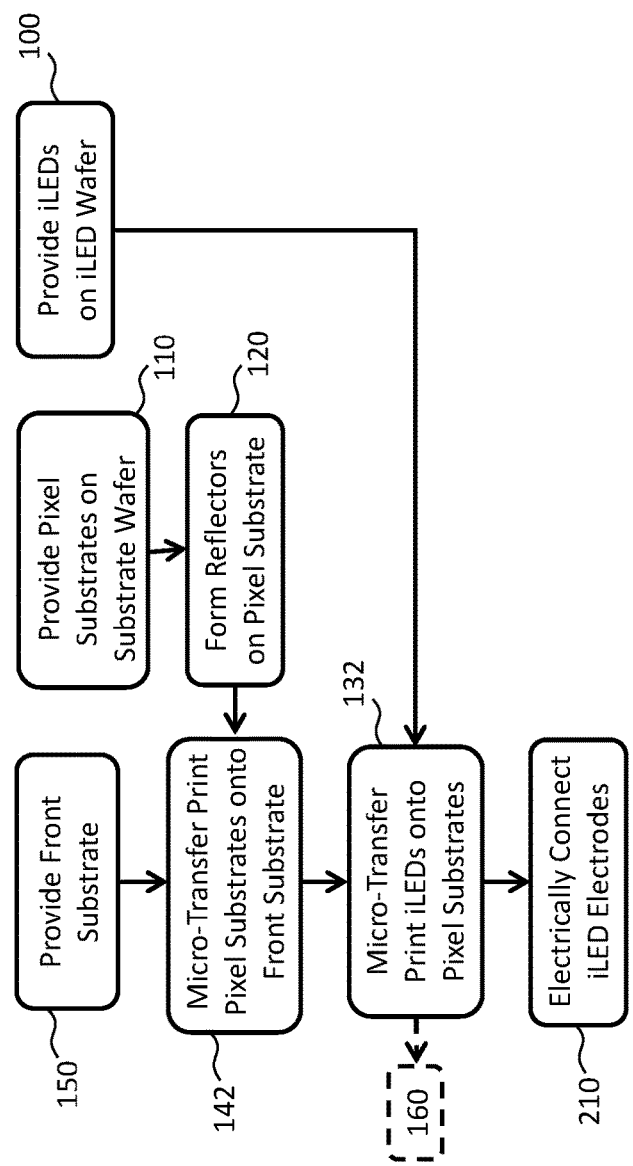

As described with respect to FIG. 7, the iLEDs 30 are micro-transfer printed onto the pixel substrate 20 in step 130 before the assembled pixel structure 10 is mounted or disposed on the front substrate 50 in step 140. In an alternative embodiment and referring to FIG. 8, the iLEDs 30 are micro-transfer printed onto the pixel substrate 20 in step 132 after the pixel substrates 20 are mounted or disposed on the front substrate 50 in step 142. As shown in FIG. 8, the iLEDs 30 are provided on one or more iLED source wafers in step 100, the pixel substrates 20 are provided on the pixel substrate wafer in step 110, and the front substrate 50 is provided in step 150. The pixel substrates 20 are micro-transfer printed onto the front substrate 50 in step 142 and the iLEDs 30 are micro-transfer printed onto the pixel substrates 20 (which are themselves on the front substrate 50) in step 132. The reflectors 40 can be formed on the pixel substrates 20 in step 120 before (as shown) or after step 142 (not shown) the pixel substrates 20 are disposed on the front substrate 50. Likewise, the reflectors 40 can be formed on the pixel substrates 20 before (as shown) or after step 132 (not shown) the iLEDs 30 are disposed on the pixel substrate 20. After the iLEDs 30 are disposed on the pixel substrates 20 in step 132, the iLED electrodes 32 can be electrically interconnected in step 210, for example using photolithography to external power, ground, or control signal sources (not shown) to form a display 80. Alternatively, a back substrate 60 is formed as described further below with respect to FIG. 10 by going to step 160.

Figure 9:
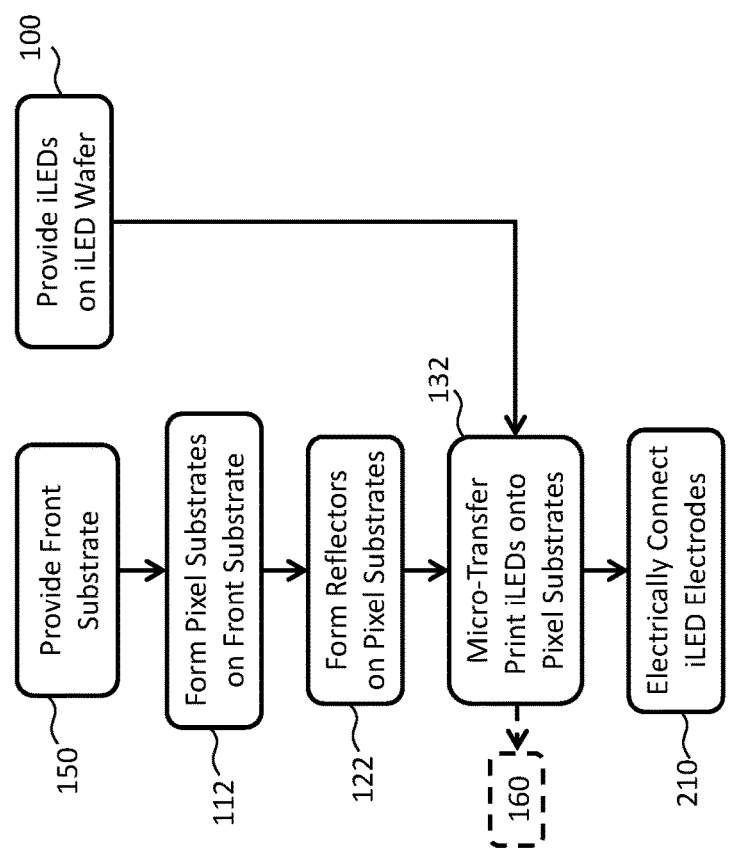

In yet another method of the present invention as illustrated in the flow diagram of FIG. 9, the iLEDs 30 are provided on one or more iLED source wafers in step 100 and the front substrate 50 is provided in step 150. In this embodiment, the pixel substrates 20 are formed and patterned on the front substrate 50 in step 112, for example by using photolithographic methods including material deposition by coating, sputtering, evaporation, or lamination. For example, a UV-curable resin such as SU8 is coated on the front substrate 50 and pattern-wise cured using a mask to form the pixel substrates 20 on the front substrate 50. The iLEDs 30 are then micro-transfer printed onto the pixel substrates 20 in step 132. As noted, the reflectors 40 can be formed on the pixel substrates 20 before (as shown in step 122) or after (not shown) the iLEDs 30 are micro-transfer printed on the pixel substrates 20 in step 132. After the iLEDs 30 are disposed on the pixel substrates 20, the iLED electrodes 32 can be electrically interconnected in step 210, for example, using photolithography to external power, ground, or control signal sources (not shown) to form a display 80.

Figure 10:
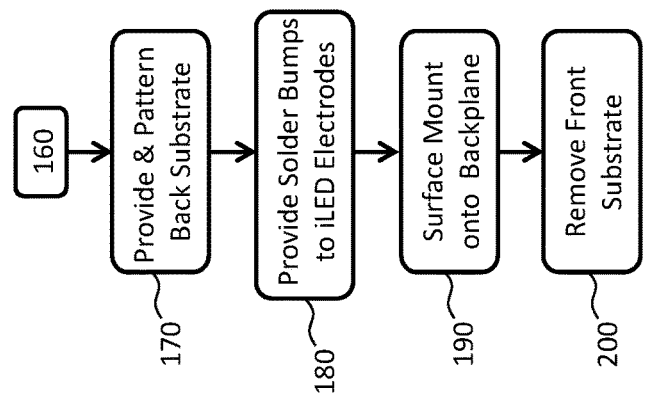

Referring to FIG. 10 in an alternative embodiment, a back substrate 60 is formed rather than a front substrate 50 provided. Beginning from step 160 a patterned back substrate 60 is formed over the pixel structures 10 in step 170, for example by coating the pixel structures 10 with a curable resin such as SU8 and patterning it to expose the iLED electrodes 32 using photolithographic methods. The back substrate material can be light absorbing, for example black and can also be the black matrix 45. In step 180, an electrical conductor 70 is patterned in electrical contact with the electrodes 32, for example using photolithographic methods. Alternatively, solder bumps can be provided in contact with the electrodes 32 and can extend at least partially over the back substrate 60 to facilitate electrically connecting the pixel structures 10 to connection pads 92 or wires on a backplane 90 (FIG. 5). The pixel structures 10 are mounted upon and electrically connected to the backplane 90 in step 190), for example using surface mount and soldering techniques. The backplane 90 can provide power, ground, and control signals for operating the pixel structures 10. The front substrate 50 can then be removed in step 200. For example, the pixel structures 10 can be adhered to the front substrate 50 with a releasable adhesive in steps 140 or 142 (FIG. 7 or 8).

In another embodiment, the pixel structures 10 are disposed, for example by micro-transfer printing, on a backplane 90. In an embodiment, the pixel substrate 20 includes connection posts 36 electrically connected to the electrodes 32, and a front substrate 50, a back substrate 60, or a backplane 90 includes electrical connections or contact pads and a method of the present invention comprises micro-transfer printing the pixel structure 10 so that the connection posts 36 are in contact with, are pressed into, or pierce respective electrical connections or contact pads.

A plurality of iLEDs 30 and a corresponding plurality of pixel substrate 20 can be provided to form a display 80. The plurality of pixel substrates 20 can be spaced apart on the front or back substrates 50, 60 and a black matrix 45 provided between the spaced-apart pixel substrates 20. In embodiments, a plurality of iLEDs 30 are provided and a method of the present invention includes micro-transfer printing the plurality of iLEDs 30 onto a common pixel substrate 20. The plurality of iLEDs 30 can include a red iLED 30 that emits red light, a green iLED 30 that emits green light, and a blue iLED 30 that emits blue light. The pixel substrate 20 can be a micro-transfer printable pixel substrate 20 formed on a substrate wafer and a method of the present invention includes micro-transfer printing the pixel substrate 20 onto a front substrate 50 or a backplane 90.

In a further embodiment of the present invention, a display 80 comprises a display substrate and a plurality of pixel structures 10 arranged on and affixed to the display substrate. Each pixel structure 10 can include a plurality of iLEDs 30, for example a red iLED 30 that emits red light, a green iLED 30 that emits green light, and a blue iLED 30 that emits blue light. The display substrate can be a front substrate 50 and the emission surfaces 24 of the pixel substrates 20 can be affixed to the front substrate 50. Alternatively, the display substrate is a back substrate 60 and the iLEDs 30 are affixed to the back substrate 60. The pixel structures 10 can be spaced apart and the space between the pixel structures 10 can include a black matrix 45.

The front substrate 50 can be transparent, for example transmitting more than 50%, 80%, 90%, or 95% of visible light, and the iLEDs 30 can emit light through the front substrate 50 to form a bottom-emitter display. In one embodiment, the pixel structures 10 and the light-absorbing black matrix 45 are provided in a common layer. In an embodiment, the light-absorbing black matrix 45 forms a contiguous surface surrounding most or all of the pixel structures 10.

The iLEDs 30 can be disposed on the pixel substrate 20 from an iLED source wafer and an integrated circuit controller can be disposed on the pixel substrate 20 from a chiplet source wafer using micro-transfer printing methods, materials, and processes. In general, a device is formed over sacrificial portions forming a sacrificial layer on a substrate. The sacrificial portions are separated by anchors and the device is attached to the substrate with a tether over the sacrificial portions of the sacrificial layer. The sacrificial layer is etched to form a gap in the sacrificial portions between the device and the substrate. A stamp is pressed against the device to fracture the tether and adhere the device to the stamp. The stamp and devices are then located adjacent to a surface of a destination substrate and the devices are pressed against an adhesive layer on the destination substrate. For a discussion of micro-transfer printing techniques see U.S. Pat. Nos. 8,722,458, 7,622,367 and 8,506,867, each of which is hereby incorporated by reference.

In another embodiment, the pixel substrate 20 is a semiconductor and the integrated circuit controller is formed in or on the pixel substrate 20 using integrated circuit materials and methods. In this embodiment, the pixel substrate 20 is chosen to be sufficiently thin and having a material and structure that does not substantially absorb the light emitted by the iLEDs 30. By 'does not substantially absorb' is meant that the light emitted by the iLEDs 30 from the pixel structure 10 is adequate for its purpose, such as for a display 80.

In another embodiment of the present invention, a transparent adhesive layer is located between the front substrate 50 and the plurality of pixel structures 10. The transparent adhesive layer is transparent to visible light or the frequencies of light emitted by the iLEDs 30 and can be 1-100 microns thick. The transparent adhesive layer adheres the spatially separated pixel structures 10 to the front substrate 50 and can maintain the position of the pixel structures 10 during subsequent processing steps, such as coating the black matrix 45. Suitable adhesives include optical clear adhesives (OCAs), polymers, or curable resins and can be optical-index matched to the front substrate 50 or to the pixel substrate 20. Index matching reduces reflections and enhances light output and resolution in a display. In a further embodiment, the transparent adhesive layer has a thickness that causes constructive optical interference for one or more of the frequencies of light emitted by the iLEDs 30 or that causes destructive optical interference for at least some frequencies of ambient light. Such a layer thickness can increase light output from the iLEDs 30 and reduces ambient light reflections, thereby increasing the contrast of the device. A further discussion of utilizing pixel substrates 20 in a display can be found in U.S. patent application Ser. No. 14/822,868 filed Aug. 10, 2015, entitled Compound Micro-Assembly Strategies and Devices, the contents of which are incorporated by reference herein in its entirety.

The display 80 of the present invention can be operated in a variety of useful ways. In one way, a display controller (not shown) provides power, a ground reference, and control signals to the pixel structures 10 through the electrical conductors 70 and electrodes 32. A display controller can be externally located for example on a separate printed circuit board substrate such as the backplane 90. The signals can provide a passive-matrix control of the iLEDs 30 in the pixel elements. In an alternative embodiment, the pixel structures 10 include an integrated control circuit and provides control signals for operating the iLEDs 30. In response to control signals from the display controller, the integrated control circuit controls the iLEDs 30 in an active-matrix control configuration.

As is understood by those skilled in the art, the terms "on," "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 pixel structure
20 pixel substrate
22 LED surface
24 emission surface
26 side
28 dielectric/reflector
30 inorganic light-emitting diode
30R red inorganic light-emitting diode
30G green inorganic light-emitting diode
30B blue inorganic light-emitting diode
31 iLED emission side
32 electrode
36 connection post
40 reflector
45 black matrix
50 front substrate
60 back substrate
62 via
70 electrical conductors
80 display
90 backplane
92 connection pad
100 provide iLEDs on iLED wafer step
110 provide pixel substrates on substrate wafer step
112 form pixel substrates on front substrate step
120 form reflectors on pixel substrates on substrate wafer step
122 form reflectors on pixel substrates on front substrate step
130 micro-transfer print iLEDs onto pixel substrates on substrate wafer step
132 micro-transfer print iLEDs onto pixel substrates on front substrate step
140 micro-transfer print pixel substrates with iLEDs onto front substrate step
142 micro-transfer print pixel substrates without iLEDs onto front substrate step
150 provide front substrate step
160 go to 160 step
170 provide and pattern back substrate step
180 provide solder bumps to iLED electrode step
190 surface mount onto backplane step
200 remove front substrate step
210 electrically connect iLED electrodes step

What is claimed:

1. An inorganic light-emitting diode (iLED) pixel structure, comprising:
    a transparent pixel substrate having an LED surface, an emission surface opposite the LED surface, and one or more sides other than the LED surface and the emission surface that are not parallel to the LED surface or the emission surface;
    an iLED mounted on the LED surface of the pixel substrate, the iLED having an emission side adjacent to the LED surface of the pixel substrate to emit light into the pixel substrate and out of the emission surface, wherein the iLED is non-native to the transparent pixel substrate; and
    a reflector disposed on at least a portion of the one or more sides.

2. The inorganic light-emitting diode (iLED) pixel structure of claim 1, wherein the pixel substrate has a thickness that is greater than a thickness of the iLED.

3. The inorganic light-emitting diode (iLED) pixel structure of claim 1, wherein the pixel structure comprises only one iLED.

4. The inorganic light-emitting diode (iLED) pixel structure of claim 1, wherein the one or more sides are each non-orthogonal to the LED surface.

5. The inorganic light-emitting diode (iLED) pixel structure of claim 1, wherein the emission surface is larger than the LED surface.

6. The inorganic light-emitting diode (iLED) pixel structure of claim 1, wherein a thickness of the pixel substrate is less than a width of the pixel substrate.

7. The inorganic light-emitting diode (iLED) pixel structure of claim 1, wherein the iLED comprises electrodes disposed on a common side of the iLED, and wherein the common side of the iLED is adjacent to the pixel substrate.

8. The inorganic light-emitting diode (iLED) pixel structure of claim 1, wherein the iLED comprises electrodes disposed on a common side of the iLED, and wherein the common side of the iLED is on a side of the iLED opposite to the side of the iLED that is adjacent to the pixel substrate.

9. The inorganic light-emitting diode (iLED) pixel structure of claim 1, wherein the iLED comprises at least a portion of a tether.

10. The inorganic light-emitting diode (iLED) pixel structure of claim 1, wherein the pixel substrate comprises at least a portion of a tether.

11. The inorganic light-emitting diode (iLED) pixel structure of claim 1, comprising a plurality of iLEDs mounted on a common pixel substrate.

12. The inorganic light-emitting diode (iLED) pixel structure of claim 1, wherein one or more of the LED surface, the emission surface, and at least a portion of the one or more sides is light diffusive.

13. The inorganic light-emitting diode (iLED) pixel structure of claim 1, wherein the iLED extends over a portion but less than all of the LED surface.

14. The inorganic light-emitting diode (iLED) pixel structure of claim 1, wherein the reflector extends over at least a portion of the LED surface that is not covered by the iLED.

15. The inorganic light-emitting diode (iLED) pixel structure of claim 1, wherein the iLED comprises electrodes and the pixel substrate comprises connection posts connected to the electrodes.

16. The inorganic light-emitting diode (iLED) pixel structure of claim 1, wherein the pixel structure has a length or width dimension of 200 µm or less.

17. A display, comprising:
a display substrate; and
a plurality of pixel structures arranged on and affixed to the display substrate, wherein each of the plurality of pixel structures comprises:
a transparent pixel substrate having an LED surface, an emission surface opposite the LED surface, and one or more sides other than the LED surface and the emission surface that are not parallel to the LED surface or the emission surface;
an iLED mounted on the LED surface of the pixel substrate, the iLED having an emission side adjacent to the LED surface of the pixel substrate to emit light into the pixel substrate and out of the emission surface, wherein the iLED is non-native to the transparent pixel substrate; and
a reflector disposed on at least a portion of the one or more sides.

18. The display of claim 17, wherein the display substrate is a front substrate and the emission surface of the pixel substrate of each of the plurality of pixel structures is affixed to the front substrate.

19. The display of claim 17, wherein the display substrate is a back substrate and the iLED of each of the plurality of pixel structures is affixed to the back substrate.

20. The display of claim 17, wherein each pixel structure comprises a plurality of iLEDs.

* * * * *